United States Patent
Kuo et al.

(10) Patent No.: US 6,537,622 B2
(45) Date of Patent: Mar. 25, 2003

(54) METHOD OF PREVENTION OF PARTICLE POLLUTION IN A PRE-CLEAN CHAMBER

(75) Inventors: Chia-ming Kuo, Hsin-chu (TW); Chao-yuan Huang, Hsin-chu (TW)

(73) Assignee: Silicon Integrated Systems Corp., Hsin-chu (TW)

(*) Notice: Subject to any disclaimer, the term of this patent is extended or adjusted under 35 U.S.C. 154(b) by 139 days.

(21) Appl. No.: 09/848,375

(22) Filed: May 4, 2001

(65) Prior Publication Data

US 2002/0164435 A1 Nov. 7, 2002

(51) Int. Cl.$^7$ ............................................. C23C 16/40
(52) U.S. Cl. ..................... 427/535; 427/579; 427/237; 427/255.27; 427/255.37; 134/1.1; 134/4; 134/8; 134/22.1; 204/192.37
(58) Field of Search .................. 427/237, 535, 427/579, 255.27, 255.37; 134/1.1, 4, 8, 22.1; 204/192.37

(56) References Cited

U.S. PATENT DOCUMENTS

| | | | | |
|---|---|---|---|---|
| 5,961,793 A | * | 10/1999 | Ngan | ..................... 204/192.12 |
| 6,143,144 A | * | 11/2000 | Golovato et al. | ...... 204/192.33 |
| 6,413,321 B1 | * | 7/2002 | Kim et al. | .................. 118/725 |

FOREIGN PATENT DOCUMENTS

JP    11-269644   * 10/1999

* cited by examiner

Primary Examiner—Timothy Meeks
(74) Attorney, Agent, or Firm—Birch, Stewart, Kolasch & Birch, LLP

(57) ABSTRACT

This method of prevention of particle pollution in a pre-clean chamber includes an oxygen gas supplying step for injecting oxygen gas into the pre-clean chamber; and a plasma generating step for ionizing the oxygen gas into plasma so as to interact with silicon-rich oxide to form a silicon oxide layer in the pre-clean chamber. The method according to the invention could prevent particle pollution due to peeling-off of silicon-rich oxide in a pre-clean chamber so as to prolong the life of a bell-jar therein.

4 Claims, 4 Drawing Sheets

METHOD OF PREVENTION OF PARTICLE POLLUTION IN A PRE-CLEAN CHAMBER

BACKGROUND OF INVENTION

1. Field of Invention

The invention related to a method of prevention of particle pollution in a pre-clean chamber, in particular, to a method for preventing particle pollution in a pre-clean chamber of a physical vapor deposition (PVD) device.

2. Related Art

During a procedure of integrated circuit (IC) manufacture, PVD devices are employed to deposite thin metal film. PVD devices, as shown in FIG. 1, include mainly a buffer chamber 1, a pre-clean chamber 2, a transfer chamber 3, a process chamber 4 and a robot arm 5.

Wherein, the pre-clean chamber 2 addresses the cleaning procedure of a Wafer 6. As illustrated in FIG. 2, the pre-clean chamber 2 includes a radio frequency (RF) generator 21, a bell-jar 22, a shield 23 and a pre-clean chamber body 24. During cleaning a wafer 6, the wafer 6 is moved by the robot arm 5 into the pre-clean chamber 2, and then argon gas is injected into the pre-clean chamber 2 to be ionized into plasma using the RF wave from the RF generator 21. (as illustrated in FIG. 3). Thereafter, the plasma produced above is sputtered onto the wafer 6 to clean the surface of wafer 6.

As described above, due to plasma sputtering in the procedure of cleaning wafers 6 some parts of the wafer 6 would be split off onto the bell-jar 22 and the shield 23. Meanwhile, when the metal deposition in PVD is that of a gate procedure, the majority of the parts split off the wafer 6 are silicon, in other words, after some pre-clearings, a large amount of silicon-rich oxide will accumulate on the bell-jar 22 and the shield 23.

In general, the bell-jar 22 are made of quartz onto which silicon-rich oxide can not adhere well, and so peeling-off occurs to pollute the pre-clean chamber 2 and the wafer 6 therein when there is a big amount of silicon-rich oxide accumulating on bell-jar 22.

After all, the pollution will cut the efficiency of the following process. To solve this problem, manufacturers in this industry have to clean the bell-jar 22 from time to time to prevent the pollution of particles peeling off from the bell-jar 22.

However, cleaning the bell-jar 22 means stopping of manufacturing, and lower efficiency. And so, how to prolong the life of the bell-jar 22 of the pre-clean chamber 2 and to reduce time for cleaning the bell-jar 22 is the key for efficiency in this business.

SUMMARY OF THE INVENTION

With problem as above, the objective of this invention is to lessen the particle pollution of pre-clean chambers, to prolong the life of bell-jars, to cut short the frequency of clearing of bell-jars 22 and to upgrade the efficiency of the production line.

The method for preventing particle pollution in a pre-clean chamber according to the invention is featured by injecting oxygen gas into the pre-clean chamber, and ionizing the oxygen gas therein by RF wave into plasma, which would interacts with silicon-rich oxide split off a wafer to form a silicon oxide layer to cover the bell-jar. And so, peeling-off of silicon-rich oxide is prevented by a layer of silicon oxide and the life of the bell-jars is prolonged.

To achieve the object mentioned above, a method for rapid preventing particles in a pre-clean chamber according to the invention includes following steps:

An oxygen gas supplying step for injecting oxygen gas into a pre-clean chamber, and A plasma generating step for electrify the oxygen gas therein into plasma by RF wave, and then the plasma produced above interacts with silicon-rich oxide to form a silicon oxide layer in the pre-clean chamber.

Wherein, due to better adherence of the silica and the bell-jar, the interaction of the oxygen gas and the silicon-rich oxide formed on the bell-jar of the pre-clean chamber produces the silicon oxide layer so as to avoid the peeling of silicon-rich oxide off the bell-jar, and to prolong the life of the bell-jar.

BRIEF DESCRIPTION OF THE DRAWINGS

These and other objects and advantages of the invention will become apparent by reference to the following description and accompanying drawings wherein.

DETAILED DESCRIPTION OF THE INVENTION

Figure 1:
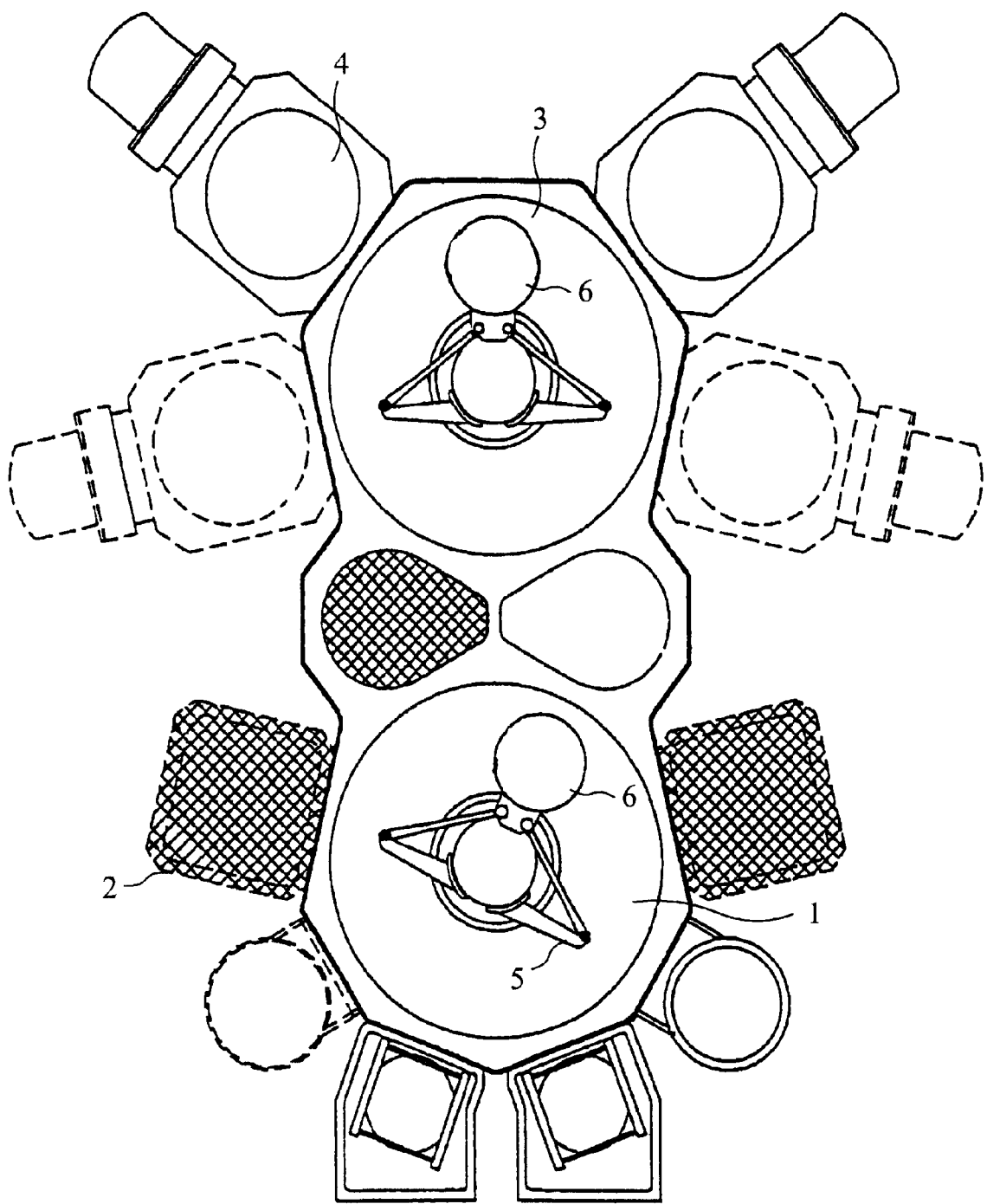
FIG. 1 is a schematic view showing the major parts of a conventional PVD device.
Figure 2:
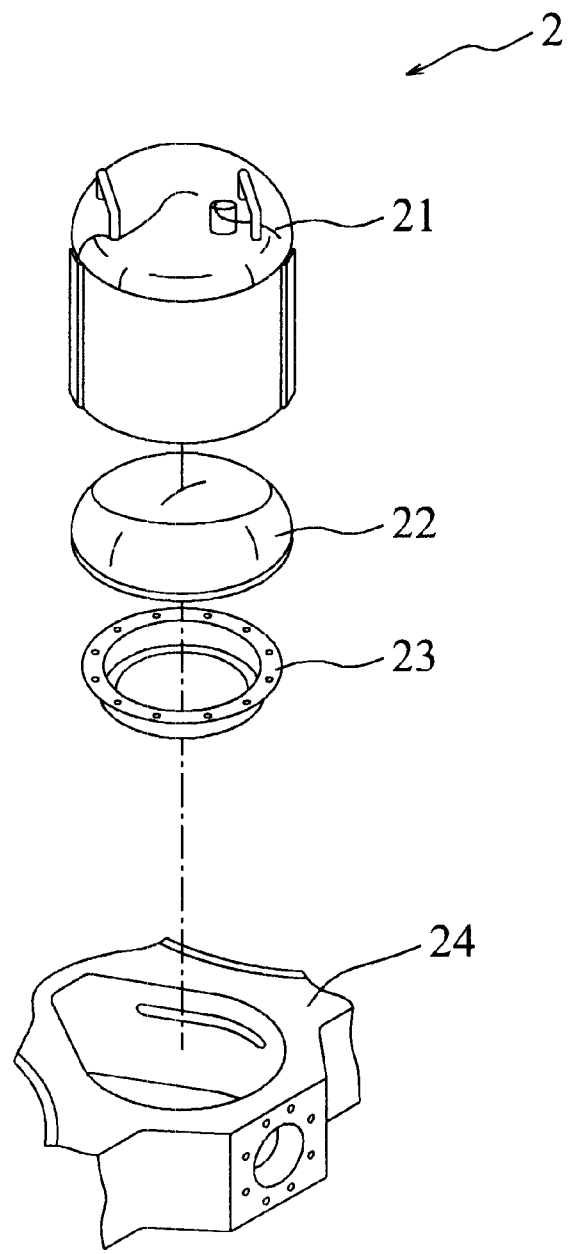
FIG. 2 is an exploded view showing parts of a conventional pre-clean chamber in a PVD device.
Figure 3:
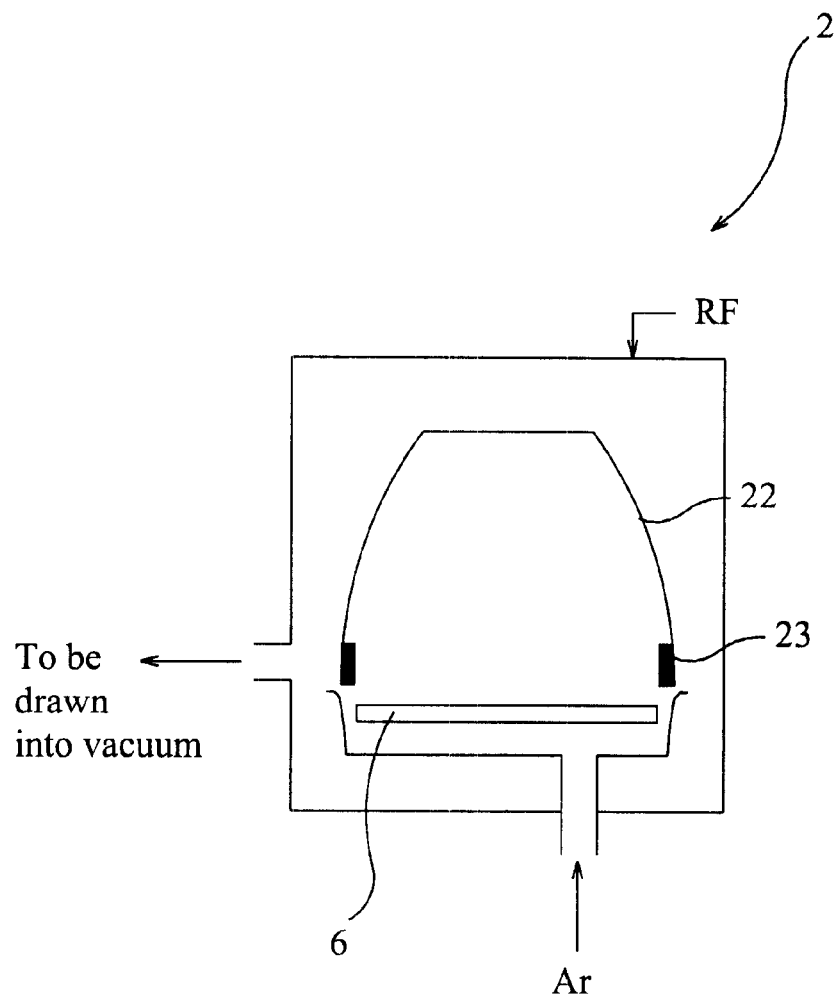
FIG. 3 is a schematic view showing the major parts of a conventional PVD device comprising a pre-clean chamber.

Hereafter, a concrete embodiment of the invention will be described in detail. In order to conveniently describe the method and avoid redundant iteration, it should be previously pointed out that the reference numerals for illustrating the pre-clean chamber of a PVD device shown in FIG. 1, FIG. 2 and FIG. 3 continue to be used in this embodiment.

The method of prevention of particle pollution in a pre-clean chamber according to the invention is used when there is certain a silicon-rich oxide layer formed on the bell-jar in the pre-clean chamber of the PVD device.

The method of prevention of particle pollution in a pre-clean chamber according to the invention includes an oxygen gas supplying step and a plasma generating step to produce plasma.

Figure 4:
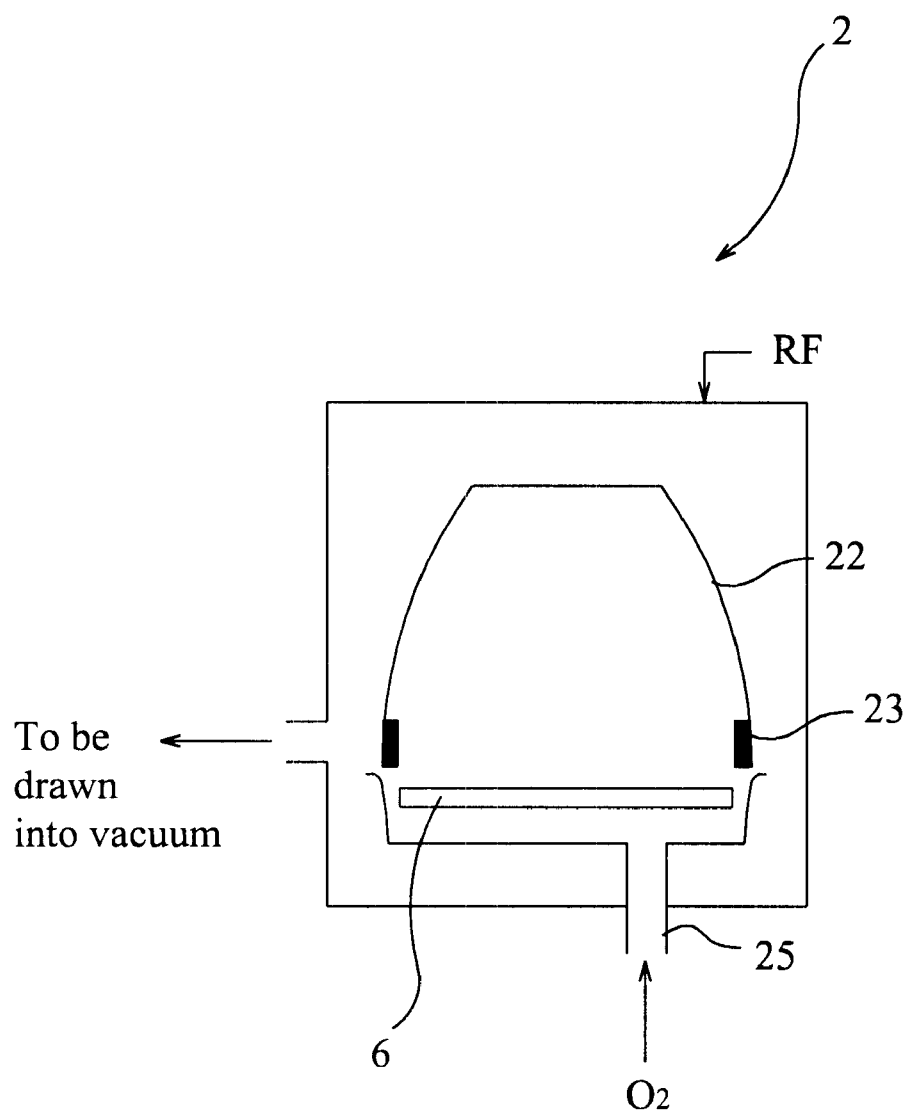
FIG. 4 is a schematic view showing the major part of a PVD device employed in one embodiment of the method of prevention of particle pollution in a pre-clean chamber according to the invention.

As illustrated in FIG. 4, in the oxygen gas supplying step, the oxygen gas is injected into the pre-clean chamber 2 through entrance 25. More precisely, the oxygen gas is injected into the whole space of the bell-jar 22 in the pre-clean chamber 2.

And, in the plasma generating step, the oxygen gas is ionized into plasma by RF wave. The plasma produced therein interacts with silicon-rich oxide to form a silicon oxide layer covering on the bell-jar 22 in the pre-clean chamber 2. In this embodiment, RF wave is emitted from the RF generator 21.

Wherein, due to better adherence of the silicon oxide and the bell-jar, the peeling-off of silicon-rich oxide is lessened as the bell-jar is covered by the silicon oxide layer which comes out of the interaction of plasma and silicon-rich oxide therein. Thus, the life of the bell-jar is prolonged, and the frequency of cleaning the bell-jar is reduced. And after all, efficiency of the production line is arisen.

While this invention has been described with reference to an illustrative embodiment, this description is not intended to be construed in a limiting sense. Various modifications and combinations of the illustrative embodiment, as well as other embodiments of the invention, will be apparent to persons skilled in the art upon reference to the description. It is therefore intended that the appended claims encompass any such modifications or embodiments.

What is claimed is:

1. A method of prevention of particle pollution in a pre-clean chamber having silicon-rich oxide, comprising:

injecting oxygen gas into the pre-clean chamber, and ionizing the oxygen gas into plasma so as to interact with the silicon-rich oxide to form a silicon oxide layer in the pre-clean chamber.

2. The method of prevention of particle pollution in a pre-clean chamber as in claim 1, wherein the pre-clean chamber is provided in a physical vapor deposition device.

3. The method of prevention of particle pollution in a pre-clean chamber as in claim 1, wherein the pre-clean chamber comprises a bell-jar, and the silicon oxide layer is formed on the bell-jar.

4. The method of prevention of particle pollution in a pre-clean chamber as in claim 3, wherein the oxygen gas is injected into the whole space of the bell-jar in the pre-clean chamber.

* * * * *